(12) United States Patent
Takahashi et al.

(10) Patent No.: US 7,354,858 B2
(45) Date of Patent: Apr. 8, 2008

(54) FILM FORMATION METHOD AND APPARATUS FOR SEMICONDUCTOR PROCESS

(75) Inventors: Yutaka Takahashi, Tokyo (JP); Satoshi Takagi, Tokyo (JP); Masahiko Tomita, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 308 days.

(21) Appl. No.: 11/091,414

(22) Filed: Mar. 29, 2005

(65) Prior Publication Data

US 2005/0227459 A1    Oct. 13, 2005

(30) Foreign Application Priority Data

Mar. 31, 2004    (JP)    ............... 2004-106048

(51) Int. Cl.
*H01L 21/44*    (2006.01)
(52) U.S. Cl. ...................... 438/684; 438/488
(58) Field of Classification Search ................ 438/96, 438/488, 482, 680, 97, 657, 647, 684, 417
See application file for complete search history.

(56) References Cited

U.S. PATENT DOCUMENTS

| | | | |
|---|---|---|---|
| 4,693,759 A | * | 9/1987 | Noguchi et al. ............... 117/8 |
| 5,863,598 A | * | 1/1999 | Venkatesan et al. ........... 438/5 |
| 6,797,651 B2 | * | 9/2004 | Hagino et al. .............. 438/798 |
| 2002/0142567 A1 | * | 10/2002 | Hagino et al. .............. 438/487 |
| 2002/0192909 A1 | * | 12/2002 | Weimer ..................... 438/257 |

FOREIGN PATENT DOCUMENTS

JP        2001-68662        3/2001

* cited by examiner

*Primary Examiner*—S. V. Clark
(74) *Attorney, Agent, or Firm*—Oblon, Spivak, McClelland, Maier & Neustadt, P.C.

(57) ABSTRACT

A film formation method for a semiconductor process is arranged to form an amorphous silicon film on a target substrate by CVD in a process field within a reaction container, while supplying a first process gas containing silicon into the process field, and setting the process field at a first temperature of 550° C. or more and at a first pressure. The method is arranged to subsequently poly-crystallize the amorphous silicon film by a heat process in the process field to form a poly-silicon film, while supplying a second process gas different from the first process gas into the process field, and setting the process field at a second temperature higher than the first temperature and at a second pressure.

14 Claims, 10 Drawing Sheets

|     | Tff (°C) | ATup | Aan/Tan (°C) | FT (nm) | RI | GS (nm) Si(111) | GS (nm) Si(220) | GS (nm) Si(311) |
|-----|----------|------|--------------|---------|------|---------|---------|---------|
| CE1 | 550 |     |     |       |      |         |         |         |
| CE2 | 580 |     |     |       |      |         |         |         |
| CE3 | 620 |     |     | 50.44 | 4.54 |         |         |         |
| PE1 | 550 | N₂  | N₂ 620 | 50.39 | 4.50 |         |         |         |
| PE2 | 550 | H₂  | H₂ 620 | 50.21 | 4.09 | 3.9/3.1 | 24.5/18.8 |       |
| PE3 | 550 | N₂  | N₂ 680 | 51.51 | 4.04 |         |         |         |
| PE4 | 550 | H₂  | H₂ 680 | 51.16 | 4.03 | 14.1    | 13.6    |         |
| PE5 | 580 | N₂  | N₂ 620 | 52.08 | 3.99 | 11.2    | 3.4     |         |
| PE6 | 580 | H₂  | H₂ 620 | 51.87 | 4.01 |         |         |         |
| PE7 | 580 | N₂  | N₂ 680 | 54.63 | 4.17 | /8.1    |         |         |
| PE8 | 580 | H₂  | H₂ 680 | 50.91 | 4.22 | 8.4     |         | 5.0/9.8 |
|     |     |     |     | 52.73 | 4.10 |         |         |         |
|     |     |     |     | 51.34 | 4.14 | 8.1/6.1 |         | 9.3/9.8 |

F I G. 7

FILM FORMATION METHOD AND APPARATUS FOR SEMICONDUCTOR PROCESS

CROSS-REFERENCE TO RELATED APPLICATIONS

This application is based upon and claims the benefit of priority from prior Japanese Patent Application No. 2004-106048, filed Mar. 31, 2004, the entire contents of which are incorporated herein by reference.

BACKGROUND OF THE INVENTION

1. Field of the Invention

The present invention relates to a film formation method and apparatus for a semiconductor process, which are used for forming a film on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

Conventionally, a poly-silicon film (poly-crystalline silicon film) is widely used for gate electrodes of MOSFETs (Metal-Oxide-Semiconductor Field Effect Transistor). In a MOSFET, a gate electrode is disposed through a gate insulating film on a channel region defined between a pair of source/drain regions. The gate electrode is used to control electric current flowing through the channel region between the source/drain regions.

In general, where a poly-silicon film is used as the gate electrode, it is deposited on the gate insulating film by CVD (Chemical Vapor Deposition). For example, mono-silane ($SiH_4$) gas is supplied as a process gas into a process field within the reaction container in which a wafer is placed. The process gas is thermally decomposed in the process field set at a temperature for poly-crystallizing silicon. As a consequence, a poly-silicon film consisting of an agglomeration of micro-crystalline grains is formed on the gate insulating film. The grain size of micro-crystalline grains can be controlled by the temperature, pressure, gas type, flow rate, etc. used in CVD.

Where a poly-silicon film is used as the gate electrode, it is doped with a carrier impurity element to be conductive. Typically, the gate electrode is doped to be of the same conductivity type as the source/drain regions. Accordingly, in the case of a P-channel MOSFET, P-source/drain regions and a P-gate electrode are formed in and on the N-silicon substrate. They are doped with a P-impurity element, such as boron (B).

Ion implantation methods are utilized to perform doping of carrier impurity elements. For example, boron used as a carrier impurity element is ionized, and accelerated by an electric field. The boron thus accelerated is selected from charged species by a mass spectroscope using a magnetic field, and further accelerated by an electric field toward a target object. At this time, the implantation energy is adjusted to control the boron implantation depth in the thickness direction of a poly-silicon film. In general, the wafer W is then subjected to a heat process to thermally diffuse the ion-implanted boron.

In recent years, in line with the general reduction in film thickness of semiconductor devices, the thickness of poly-silicon films used as gate electrodes has been reduced to around 0.1 μm. Where a thin poly-silicon film is used, boron may penetrate through the poly-silicon film during ion implantation of the boron. If boron reaches the gate insulating film or channel region below the poly-silicon film, it deteriorates the electrical properties of the device. Conversely, if the ion implantation energy of boron is insufficient, the boron is reflected off the surface of the poly-silicon film and thus is not implanted. Accordingly, there is a certain lower limit to the implantation energy.

BRIEF SUMMARY OF THE INVENTION

An object of the present invention is to provide a film formation method and film formation apparatus for a semiconductor process to form a poly-silicon film that can prevent a carrier impurity element from penetrating therethrough in the thickness direction when the impurity element is ion-implanted in a subsequent step.

According to a first aspect of the present invention, there is provided a film formation method for a semiconductor process, comprising:

forming an amorphous silicon film on a target substrate by CVD in a process field within a reaction container, while supplying a first process gas containing silicon into the process field, and setting the process field at a first temperature of 550° C. or more and at a first pressure; and poly-crystallizing the amorphous silicon film by a heat process in the process field to form a poly-silicon film, while supplying a second process gas different from the first process gas into the process field, and setting the process field at a second temperature higher than the first temperature and at a second pressure.

According to a second aspect of the present invention, there is provided a film-formation apparatus for a semiconductor process, comprising:

a reaction container having a process field configured to accommodate a target substrate;

a heater configured to heat the process field;

an exhaust system configured to exhaust the reaction container;

a first gas supply circuit configured to supply a first process gas containing silicon into the reaction container;

a second gas supply circuit configured to supply a second process gas different from the first process gas into the reaction container; and a control section configured to control an operation of the apparatus, wherein the control section executes forming an amorphous silicon film on the target substrate by CVD in the process field, while supplying the first process gas into the process field, and setting the process field at a first temperature of 550° C. or more and at a first pressure; and poly-crystallizing the amorphous silicon film by a heat process in the process field to form a poly-silicon film, while supplying the second process gas into the process field, and setting the process field at a second temperature higher than the first temperature and at a second pressure.

According to a third aspect of the present invention, there is provided a computer readable medium containing program instructions for execution on a processor, which, when executed by the processor, cause a film-formation apparatus for a semiconductor process to execute forming an amorphous silicon film on a target substrate by CVD in a process field within a reaction container, while supplying a first process gas containing silicon into the process field, and setting the process field at a first temperature of 550° C. or more and at a first pressure; and poly-crystallizing the amorphous silicon film by a heat process in the process field to form a poly-silicon film, while supplying a second process gas different from the first process gas into the process field, and setting the process field at a second temperature higher than the first temperature and at a second pressure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 7 is a characteristic diagram showing the results of crystal structure analysis by X-ray diffraction and measurement of refractive index, which were performed on poly-silicon films according to comparative examples and present examples;

DETAILED DESCRIPTION OF THE INVENTION

In the process of developing the present invention, the inventors studied problems about poly-silicon films through which boron penetrates during ion implantation. As a result, the inventors have arrived at the findings given below.

Figure 10A:
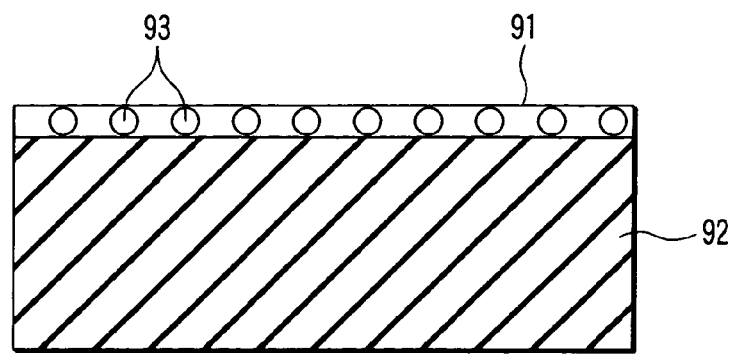
FIGS. 10A and 10B are sectional views showing a crystal growth state in forming a poly-silicon film by a conventional film formation method.
Figure 10B:
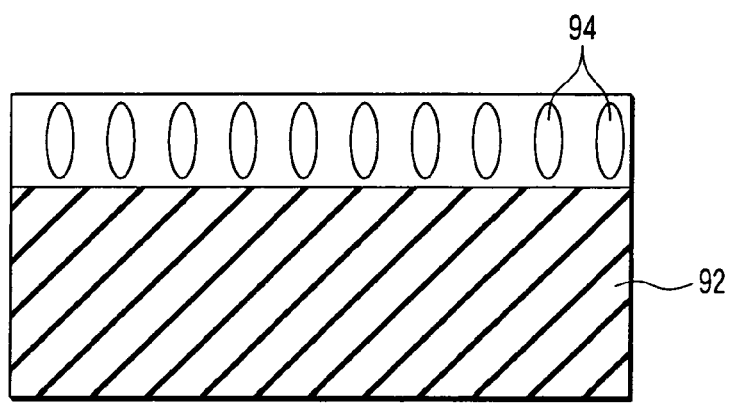

FIGS. 10A and 10B are sectional views showing a crystal growth state in forming a poly-silicon film by a conventional film formation method. For example, where a poly-silicon film is formed, a process gas, such as silane gas, is thermally decomposed at a temperature for poly-crystallizing silicon, such as 620° C. In this case, crystal growth for the poly-silicon film 91 starts from a gate insulating film 92 side, and nuclei 93 for spindle-shaped crystals are generated in the early stage of this film formation. As a consequence, spindle-shaped crystals 94 tend to be formed in the poly-silicon film 91 on the gate insulating film 92 side.

Figure 11:
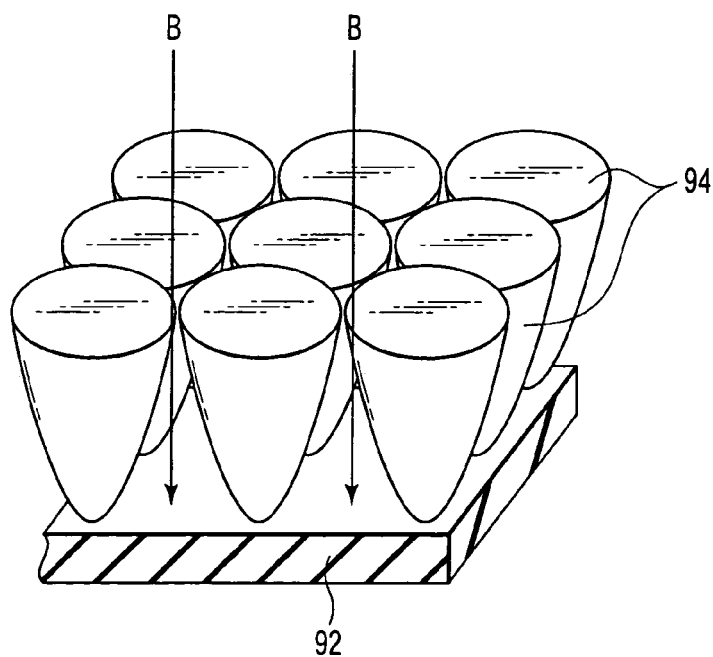
FIG. 11 is a perspective view showing the crystal structure of a poly-silicon film formed by a conventional film formation method, and a manner of performing ion implantation of boron thereon.

FIG. 11 is a perspective view showing the crystal structure of a poly-silicon film formed by a conventional film formation method, and a manner of performing ion implantation of boron thereon. Where the crystal structure of the poly-silicon film is formed of spindle-shaped crystals, the crystals are longitudinal in the thickness direction of the poly-silicon film. In this case, the number of crystal grain boundaries in the vertical direction is small, and boron thereby penetrates mainly through portions between crystals in ion implantation. Even if spherical crystals are produced above the spindle-shaped crystals during formation of the poly-silicon film, it is thought that boron is scarcely prevented from penetrating therethrough.

Figure 12A:
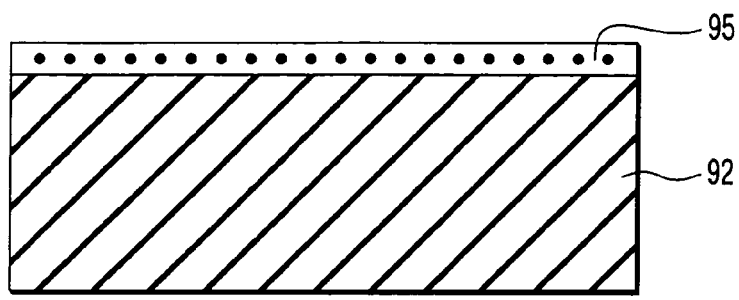
FIGS. 12A to 12C are sectional views showing a crystal growth state in forming a poly-silicon film by another conventional film formation method.
Figure 12B:
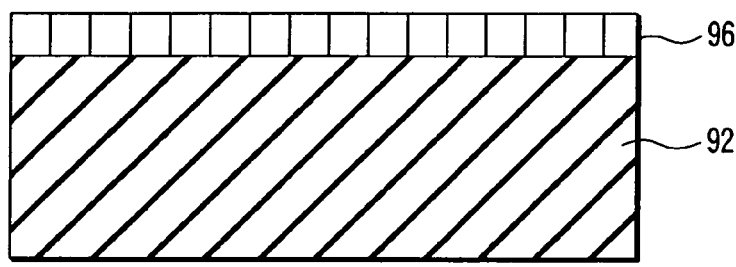
Figure 12C:
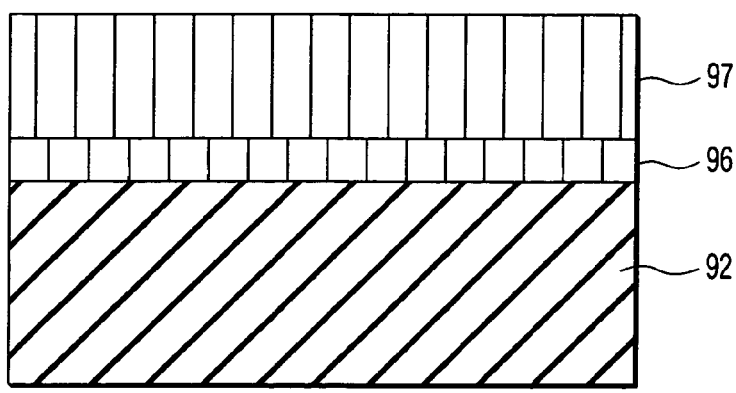

Jpn. Pat. Appln. KOKAI Publication No. 2001-68662 (which will be referred to as Patent publication 1) discloses a technique to prevent boron penetration of this kind. FIGS. 12A to 12C are sectional views showing a crystal growth state in forming a poly-silicon film by the film formation method disclosed in Patent publication 1. In this film formation method, at first, as shown in FIG. 12A, a thin amorphous semiconductor layer 95 is formed on an underlying layer 92. Then, the amorphous semiconductor layer 95 is heat-processed and thereby transformed to a poly-crystalline semiconductor layer 96. Then, a second poly-crystalline semiconductor layer 97 is deposited on the poly-crystalline semiconductor layer 96. In summary, a first step is used to form a thin amorphous semiconductor layer 95, a second step is used to poly-crystallize the amorphous semiconductor layer 95, and a third step is used to grow a poly-crystalline semiconductor layer 97.

The present inventors have found that there is some correlation between the crystal structure of an amorphous silicon film and the film formation temperature. As described later, where the film formation temperature is set to be from 560 to 600° C., an amorphous silicon film is formed to have a number of nuclei dispersed therein.

On the other hand, the method disclosed in Patent publication 1 performs the first step to form a thin amorphous silicon film at 530° C. (see paragraph number [0023] of Patent publication 1). As a consequence, it is believed that the method disclosed in Patent publication 1 brings about the following problems. Specifically, where the amorphous semiconductor layer 95 is formed at 530° C., the layer does not contain nuclei dispersed therein. In this case, the thin amorphous semiconductor layer 95 has a rough surface, from which nuclei grow to be columnar to form a poly-crystalline structure in the second step. Accordingly, the poly-crystalline semiconductor layers 96 and 97 according to Patent publication 1 are formed of columnar crystals.

Further, Patent publication 1 discloses measurement of grain size for the purpose of forming a poly-crystalline semiconductor layer 97 having a grain size of, e.g., 25 nm or less. In this measurement, since grains are observed from above, the grain size is the size of micro-crystalline grains appearing in the plan view. This also means that the crystals of the poly-crystalline semiconductor layer 97 are columnar. Accordingly, the poly-crystalline semiconductor layers 96 and 97 according to Patent publication 1 cannot prevent boron penetration during ion implantation of boron.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1:
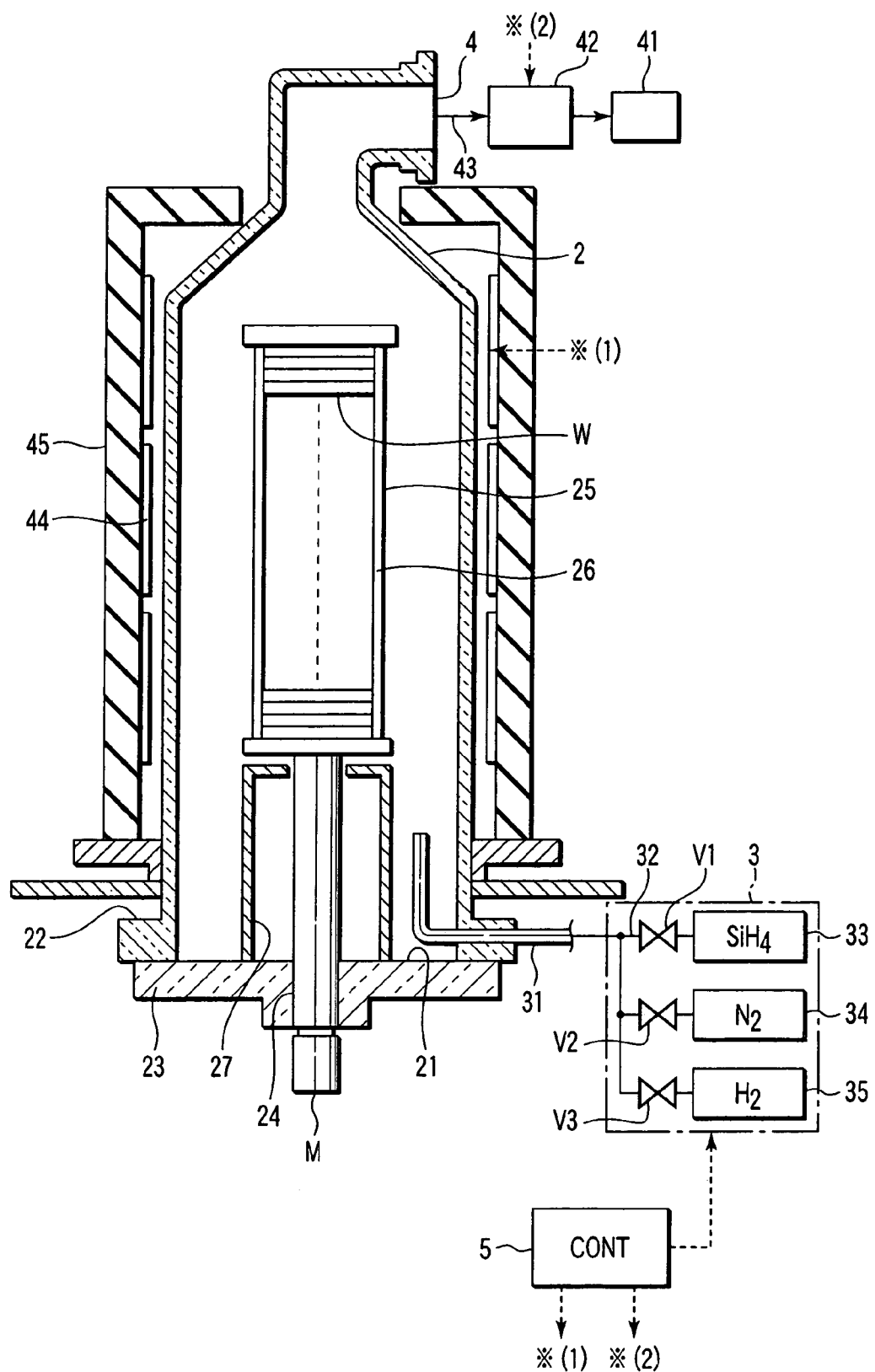
FIG. 1 is a structural view showing a vertical heat-processing apparatus according to an embodiment of the present invention.

FIG. 1 is a structural view showing a vertical heat-processing apparatus according to an embodiment of the present invention. As shown in FIG. 1, the heat-processing apparatus (vacuum CVD apparatus) 1 includes a cylindrical reaction container 2, which is made of, e.g., quartz and directed vertically. The reaction container 2 is opened at the bottom to form a load port 21, around which a flange 22 is integrally formed. A lid 23 made of, e.g., quartz is disposed below the reaction container 2, so that the lid 23 can come into contact with the bottom of the flange 22 to airtightly close the port 21. The lid 23 is moved up and down by a boat elevator (not shown) to open and close the port. A rotary shaft 24 extends through the center of the lid 23, and supports a substrate holder or wafer boat 25 at the top.

The wafer boat 25 includes three or more, e.g., four, struts 26. The struts 26 have grooves (slots) to support a plurality of, e.g., 125, target substrates or semiconductor wafers W stacked at intervals. The 125 wafers W consist of dummy wafers disposed at the top and bottom sides, and product wafers placed therebetween. The bottom of the rotary shaft 24 is connected to a motor M for rotating the rotary shaft 24, so that the wafer boat 25 is rotated by the motor M. A heat-insulating unit 27 is disposed on the lid 23 and surrounds the rotary shaft 24.

An injector 31 having an L-shape is disposed to extend through the flange 22 at the bottom of the reaction container 2, and is used to supply gases onto the wafers W within the reaction container 2. The proximal end of the injector 31 is connected to a gas supply line 32 of a gas supply section 3. The proximal end of the gas supply line 32 is divided into three circuits. One of the circuits is provided with a supply source 33 of a silane family gas, such as mono-silane ($SiH_4$) gas, used as a film formation gas containing silicon, a mass-flow controller (not shown), and a valve V1 disposed thereon in this order from the upstream side. Another one of the circuits is provided with a supply source 34 of an inactive gas, such as nitrogen ($N_2$) gas, a mass-flow controller (not shown), and a valve V2 disposed thereon in this order from the upstream side. The other one of the circuits is provided with a supply source 35 of hydrogen ($H_2$) gas, a mass-flow controller (not shown), and a valve V3 disposed thereon in this order from the upstream side.

The film formation gas containing silicon typically consists of a silane family gas. The silane family gas is not limited to mono-silane gas, and it may be a gas selected from the following materials: disilane ($Si_2H_6$), dichloro silane ($SiH_2Cl_2$), tetrachloro silane ($SiCl_4$), hexachloro silane ($Si_2Cl_6$), hexaethylamino disilane, hexamethyl disilazane, disilylamine, trisilylamine, and bistertialbutylamino silane.

An exhaust port 4 is formed at the top of the reaction container 2 to exhaust the interior of the reaction container 2. The exhaust port 4 is connected to an exhaust line 43 provided with a vacuum pump 41 and a pressure regulator 42 to vacuum-exhaust the interior of the reaction container 2 to a desired vacuum level. A furnace 45 is disposed around the reaction container 2, and includes a heater 44 for heating up the interior of the reaction container 2. The heater 44 is formed of a carbon wire heater, which allows a process to be performed with least contamination, i.e., with high cleanness, and allows the temperature to be quickly increased and decreased.

Further, the vacuum CVD apparatus 1 includes a control section 5 formed of a computer. The control section 5 is configured to activate a process program and read the description of a process recipe stored in a storage section (described later), so as to control the process conditions in accordance with the recipe. The control section 5 outputs control signals to respectively control the heater 44, pressure regulator 42, and gas supply devices (such as valves, mass-flow controllers, etc.) of the gas supply section 3.

Figure 2:
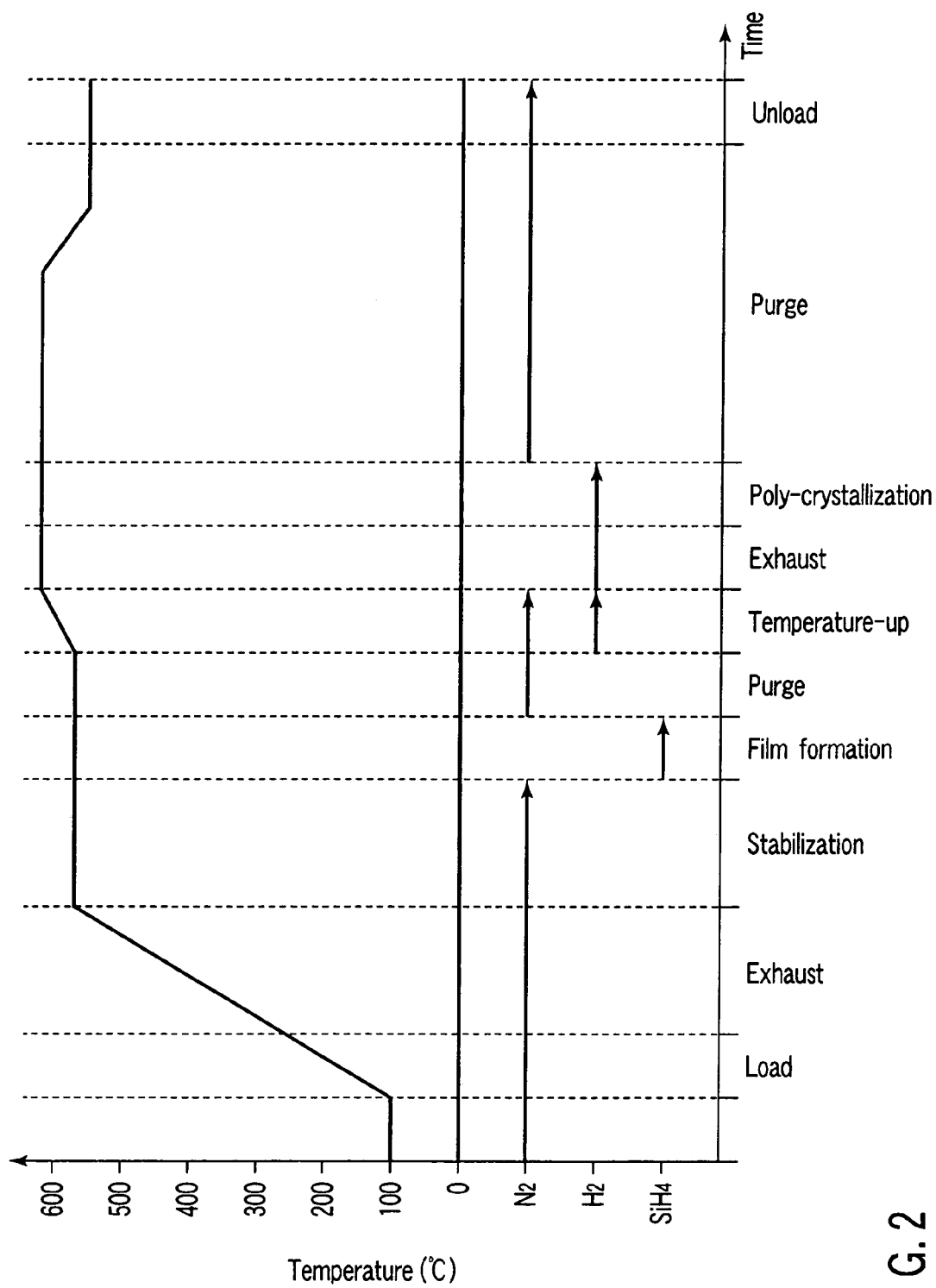
FIG. 2 is a view showing the temperature profile, steps, and feed process gases of a film formation method according to an embodiment of the present invention.
Figure 3:
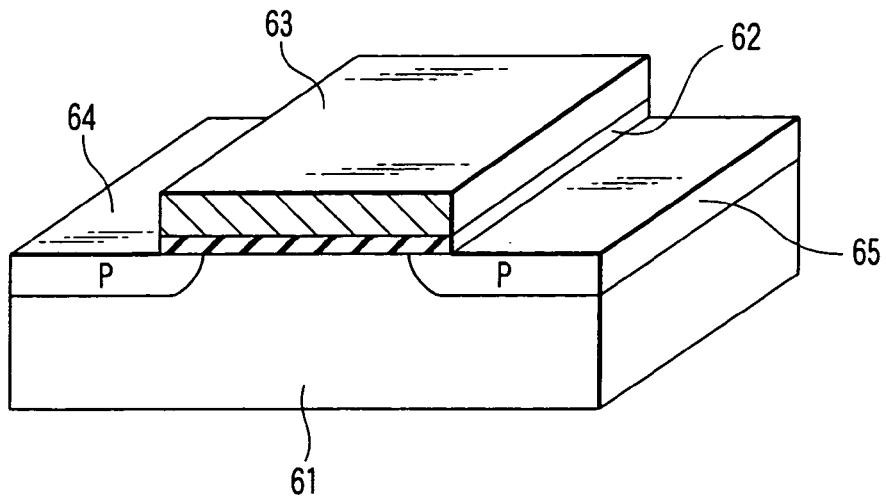
FIG. 3 is a perspective view showing a MOSFET which employs as a gate electrode a poly-silicon film according to the embodiment of the present invention.

Next, with reference to FIGS. 2 and 3, an explanation will be given of a film formation method according to an embodiment of the present invention, performed in the vacuum CVD apparatus 1 described above. FIG. 2 is a view showing the temperature profile, steps, and feed process gases of a film formation method according to an embodiment of the present invention. FIG. 3 is a perspective view showing a MOSFET which employs as a gate electrode a poly-silicon film according to the embodiment of the present invention.

First, as shown in FIG. 3, silicon wafers W are prepared, each of which is formed of an N-type silicon substrate 61 with a silicon oxide film ($SiO_2$) 62 disposed thereon as a gate insulating film. A predetermined number of such wafers W are stacked at intervals on a wafer boat 25, and the wafer boat 25 is then moved up by the boat elevator (not shown). With this operation, the wafer boat 25 is loaded into the process field within the reaction container 2, and the bottom port of the flange 22 is closed by the lid 23. During this loading, the process field within the reaction container 2 is maintained at about 100° C.

Then, the process field containing the wafer boat 25 is heated up at a heating-up rate of, e.g., 200° C./minute to a first process temperature. At the same time, the interior of the reaction container 2 is exhausted by the vacuum pump 41 through the exhaust port 4 to set the process field at a predetermined vacuum level. The first process temperature is set at a temperature of 550° C. or more and not beyond the temperature range to obtain amorphous silicon, and is set at 580° C., for example. The temperature range to obtain amorphous silicon is defined by a temperature of, e.g., 600° C. or less, above which silicon becomes poly-silicon.

After the process field is stabilized at a temperature of 580° C., mono-silane gas is supplied at a predetermined flow rate of, e.g., 180 to 4000 sccm from the film formation gas supply source 33 into the reaction container 2. Further, the pressure of the process field is set at a vacuum of, e.g., 13.3 to 40 Pa (0.1 to 0.3 Torr) by the pressure regulator 42. Under these conditions, a CVD process is performed for about 10 minutes to conduct a film formation step of an amorphous silicon film. In the film formation step, the wafer boat 25 is rotated by the motor M at a constant speed.

During the film formation step, the mono-silane gas is thermally decomposed within the reaction container 2, and an amorphous silicon film containing silicon and hydrogen is formed on the surface of the gate insulating film 62 on the wafer W. As described later, this film formation step needs to be performed at a temperature of 550° C. or more, and preferably 560° C. or more. The upper limit of the temperature for this step is determined by the temperature range to obtain amorphous silicon, and is thought to be 600° C. in practice in consideration of some margin.

Then, the film formation gas is stopped while nitrogen gas is supplied to perform purging with the nitrogen gas to remove the residual gas from the reaction container 2. Then, hydrogen gas is also supplied, along with nitrogen gas being supplied, into the reaction container 2. Further, the process field is heated up at a heating-up rate of, e.g., 50° C./minute to a second process temperature higher than the first process temperature. The second process temperature is set to be within a temperature range to poly-crystallize the amorphous silicon film, which is defined by a temperature of, e.g., 610 to 700° C., and is set at 620° C., for example. Then, the nitrogen gas is stopped while the hydrogen gas is supplied into the reaction container 2. Further, the pressure of the process field is set at a vacuum of, e.g., 2660 to 26600 Pa (20 to 200 Torr) by the pressure regulator 42.

Under these conditions, heat-processing (annealing) is performed for about 10 minutes to conduct a poly-crystallization step of the amorphous silicon film. In this step, the amorphous silicon film is transformed into a poly-silicon film. The hydrogen gas is stopped after a predetermined period of time elapses. From the film formation step to the end of the poly-crystallization step, the wafer boat 25 is kept rotated by the motor M.

As a consequence, a poly-silicon film having a predetermined thickness of, e.g., 150 nm is formed on the gate insulating film 62. Then, nitrogen gas is supplied into the reaction container 2 to perform purging and return the interior of the reaction container 2 to atmospheric pressure. Further, the process field is cooled down to a temperature of, e.g., 300 to 600° C. Then, the wafer boat 25 is transferred out of the reaction container 2 (unloading).

Then, the wafer W is transferred into an ion implantation apparatus (not shown), and a carrier impurity element, such as boron, is ion-implanted into the poly-silicon film. Further, a carrier impurity element is ion-implanted into the silicon substrate 61 at positions corresponding to source/drain regions 64 and 65 (see FIG. 3).

Then, the wafer W is transferred into another processing system (not shown), and the poly-silicon film is patterned into a gate electrode 63 by photolithography and etching. Further, source/drain electrodes are formed on the source/drain regions 64 and 65, thereby completing the semiconductor apparatus or MOSFET.

The method according to the embodiment provides a poly-silicon film formed of fine grains or micro-crystalline grains, which are granular or spherical. In this case, when boron (a carrier impurity element) is ion-implanted in a subsequent step, boron is trapped at grain boundaries. As a consequence, even if the gate electrode 63 is as thin as, e.g., about 0.1 μm, the carrier impurity element (boron) is prevented from penetrating therethrough, and thus the ion implantation can be reliably performed. Specifically, it is possible to solve the problem in that the carrier impurity element reaches the gate insulating film 62 or channel region below the poly-silicon film 63 and deteriorates the electrical properties of the device.

Figure 4A:
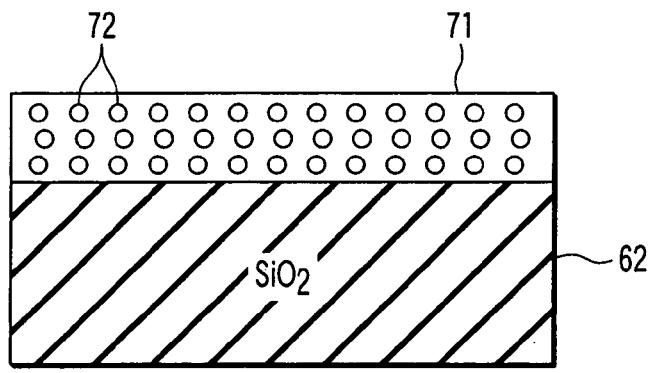
FIGS. 4A and 4B are sectional views showing a crystal growth state in forming a poly-silicon film by the film formation method according to the embodiment.
Figure 4B:
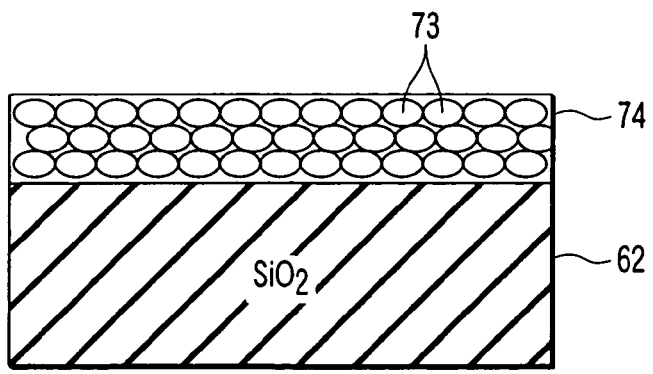
Figure 5:
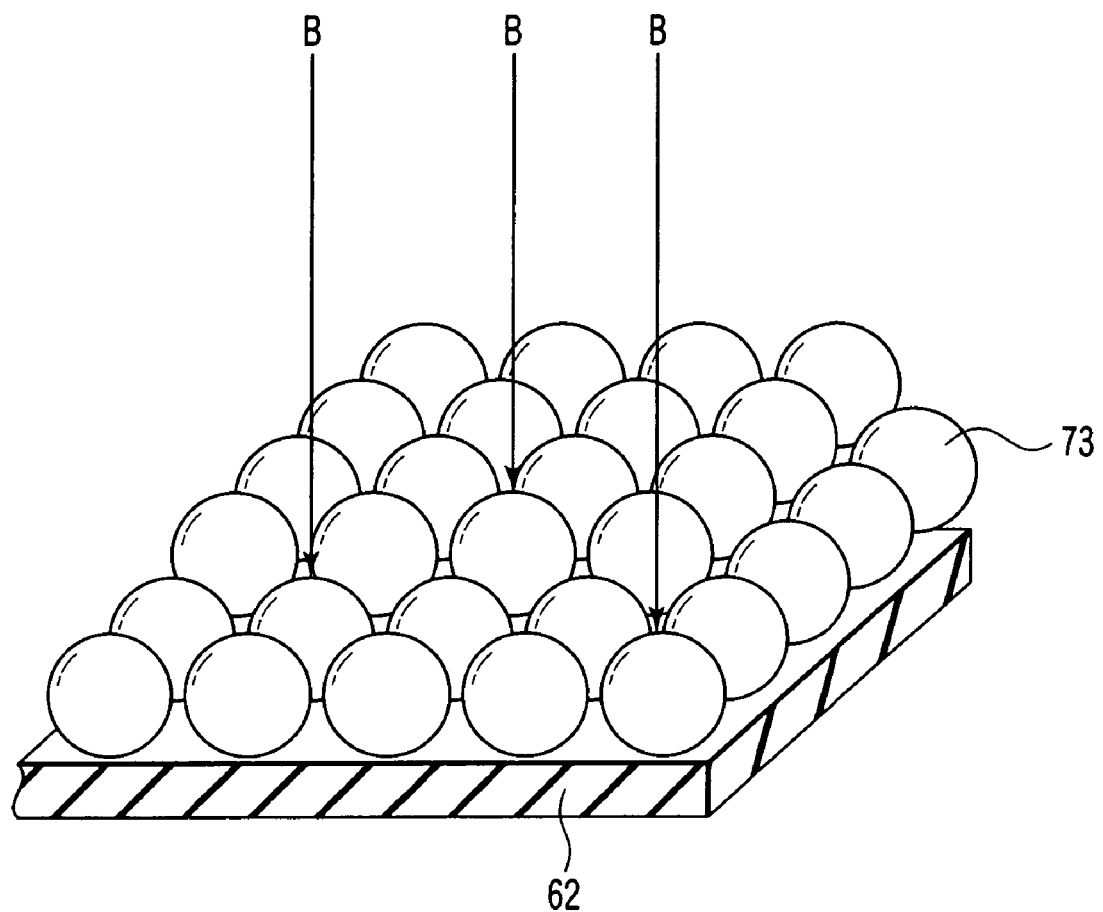
FIG. 5 is a perspective view showing the crystal structure of a poly-silicon film formed by the film formation method according to the embodiment, and a manner of performing ion implantation of boron thereon.

As described above, a poly-silicon film thus formed comprises spherical micro-crystalline grains and prevents a carrier impurity element from penetrating therethrough. This is thought to be due to the following. FIGS. 4A and 4B are sectional views showing a crystal growth state in forming a poly-silicon film by the film formation method according to the embodiment. FIG. 5 is a perspective view showing the crystal structure of a poly-silicon film formed by the film formation method according to the embodiment, and a manner of performing ion implantation of boron thereon.

In the method according to the embodiment, the film formation step is performed at a temperature of 580° C. In this step, as shown in FIG. 4A, an amorphous silicon film 71 is formed with a number of nuclei 72 dispersed therein. Then, the poly-crystallization step is performed at a temperature for poly-crystallizing silicon, which is higher than that of the film formation step. In this step, as shown in FIG. 4B, the nuclei 72 generated in the film formation step are re-crystallized by the heat process and micro-crystalline grains grow from the nuclei 72 to produce spherical crystals 73. The term "spherical crystal" is used to discriminate from "spindle-shaped crystal" mentioned above, and thus is not intended only to encompass shapes close to regular spheres. The term "spherical crystal" encompasses shapes deformed from spheres, as long as they have grown rather equally in three dimensional directions from nuclei in an amorphous silicon film.

Where micro-crystalline grains are spherical crystals, a number of grain boundaries are randomly formed in various directions, and they have a lot of dangling bonds. As shown in FIG. 5, when an active carrier impurity element, such as boron, is ion-implanted into the poly-silicon film 73 in a subsequent step, the random grain boundaries and dangling bonds present thereon described above work as a barrier against movement or diffusion of the boron or the like. As a consequence, the boron is trapped by the grain boundaries and prevented from penetrating through the poly-silicon film in the thickness direction.

In order to form a poly-silicon film comprising spherical crystals, it is necessary to form an amorphous silicon film in a first stage, and then to poly-crystallize the amorphous silicon film in the second stage. As evidenced by present examples described later, in the first stage, the film formation step is performed at a temperature of 550° C. or more and lower than the temperature to form poly-silicon, and preferably from 560 to 600° C. In the second stage, the poly-crystallization step of the amorphous silicon film (heat process) is performed at a temperature of, e.g., 610 to 700° C., and at 620° C., for example.

As evidenced by present examples described later, there is some correlation between the crystal structure of an amorphous silicon film and the film formation temperature. In accordance with this correlation, film formation of the amorphous silicon film should be performed at a temperature of 550° C. or more. Further, in order to form the amorphous silicon film with a number of nuclei dispersed therein, the temperature of the film formation is preferably set to be from 560 to 600° C. However, where the amorphous silicon film is formed at 550° C., a poly-silicon film obtained thereafter contains spherical crystals and spindle-shaped crystals in a mixed state. Even in this case, the number of grain boundaries is larger than conventional poly-silicon films formed of spindle-shaped crystals, and thus can prevent a carrier impurity element from penetrating through the poly-silicon film in the thickness direction.

Where the film formation temperature is 550° C., degree of dispersion of nuclei in the amorphous silicon film is lower than that of the case where the film formation temperature is 560° C. However, the nuclei are still dispersed, and crystals then grow from the nuclei and amorphous silicon film surface in the poly-crystallization step. As a consequence, it is thought that the poly-silicon film contains spherical crystals and spindle-shaped crystals in a mixed state.

On the other hand, the method disclosed in Patent publication 1 described previously performs the first step at 530° C., and it is thus believed that the amorphous semiconductor layer formed in this step does not contain nuclei dispersed therein.

Figure 9:
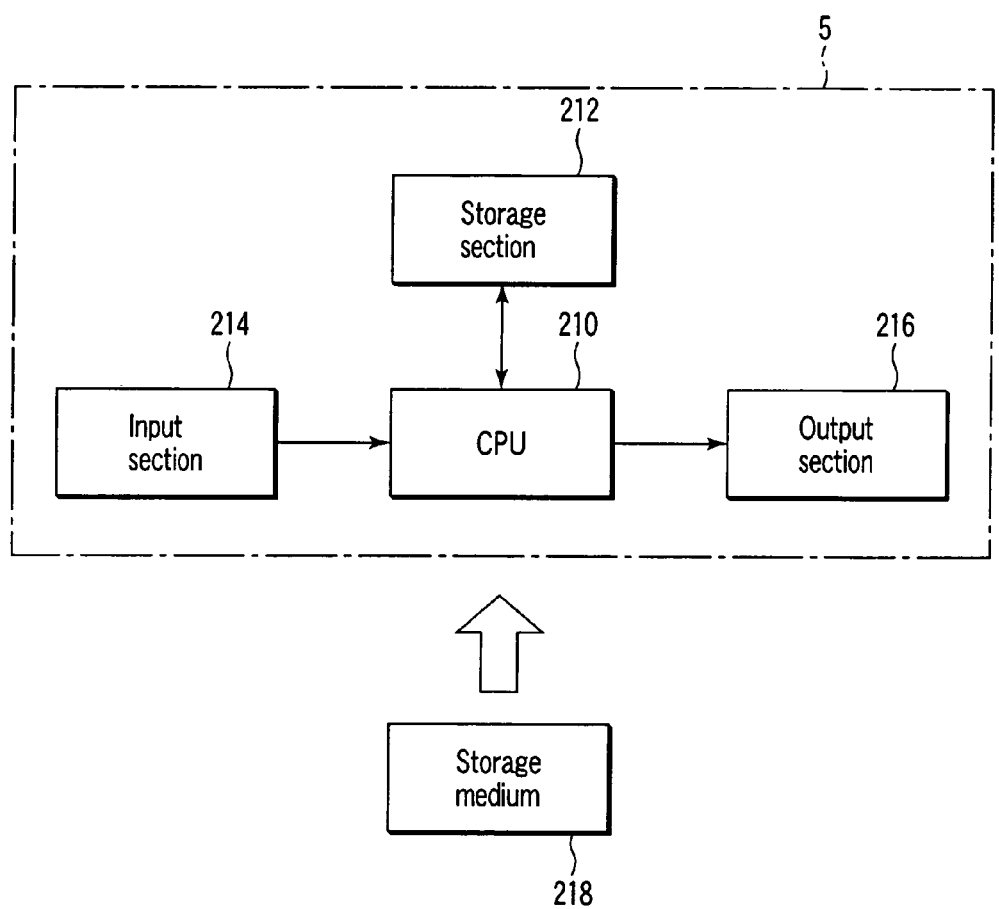
FIG. 9 is a block diagram schematically showing the structure of a control section.

The method according to the embodiment is performed under the control of the control section 5 in accordance with a process program, as described above. FIG. 9 is a block diagram schematically showing the structure of the control section 5. The control section 5 includes a CPU 210, which is connected to a storage section 212, an input section 214, and an output section 216. The storage section 212 stores process programs and process recipes. The input section 214 includes input devices, such as a keyboard, a pointing device, and a storage media drive, to interact with an operator. The output section 216 outputs control signals for controlling components of the processing apparatus. FIG. 9 also shows a storage medium 218 attached to the computer in a removable state.

The method according to the embodiment may be written as program instructions for execution on a processor, into a computer readable storage medium or media to be applied to a semiconductor processing apparatus. Alternately, program instructions of this kind may be transmitted by a communication medium or media and thereby applied to a semiconductor processing apparatus. Examples of the storage medium or media are a magnetic disk (flexible disk, hard disk (a representative of which is a hard disk included in the storage section 212), etc.), an optical disk (CD, DVD, etc.), a magneto-optical disk (MO, etc.), and a semiconductor memory. A computer for controlling the operation of the semiconductor processing apparatus reads program instructions stored in the storage medium or media, and executes them on a processor, thereby performing a corresponding method, as described above.

EXPERIMENT

Present Example 1

A present example according to the embodiment was prepared, using the apparatus shown in FIG. 1, in which a poly-silicon film was formed to have a thickness of 50 nm on a gate insulating film 62 (see FIG. 3) consisting of a silicon oxide film. In the present example, the conditions were set as described above, i.e., the film formation temperature at 580° C., the annealing temperature at 620° C., the temperature-up from the film formation temperature to the annealing temperature under a hydrogen atmosphere within the reaction container, and the annealing under a hydrogen atmosphere within the reaction container. Then, a cross section in the thickness direction of the poly-silicon film thus formed was observed by a TEM (Transmission Electron Microscope).

A comparative example was prepared, using the apparatus shown in FIG. 1, in which a poly-silicon film was formed to have a thickness of 50 nm on a gate insulating film 62 (see FIG. 3) consisting of a silicon oxide film. In the comparative example, the poly-silicon film was directly formed at a film formation temperature of 620° C. (a conventional method). Then, a cross section in the thickness direction of the poly-silicon film thus formed was observed by a TEM (Transmission Electron Microscope).

Figure 6A:
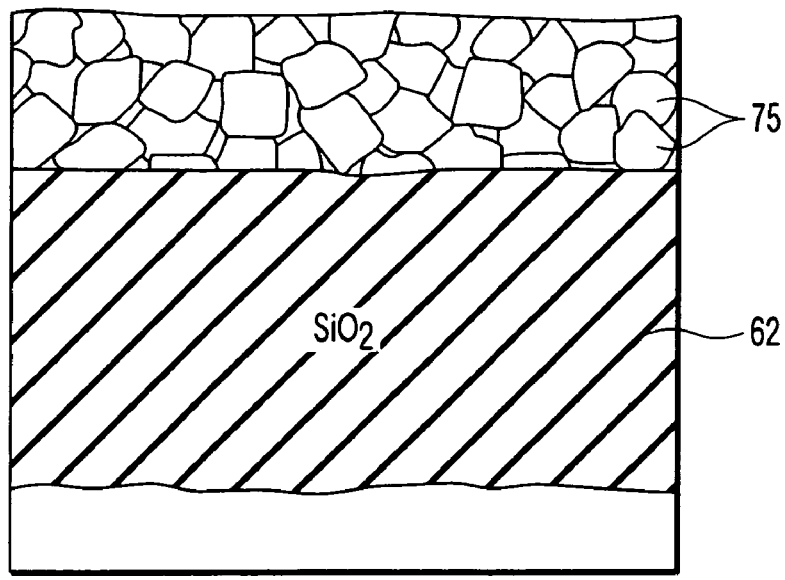
FIGS. 6A and 6B are sectional views showing a poly-silicon film formed by the film formation method according to the embodiment and a poly-silicon film formed by a conventional method, respectively, which were observed by a TEM (Transmission Electron Microscope)
Figure 6B:
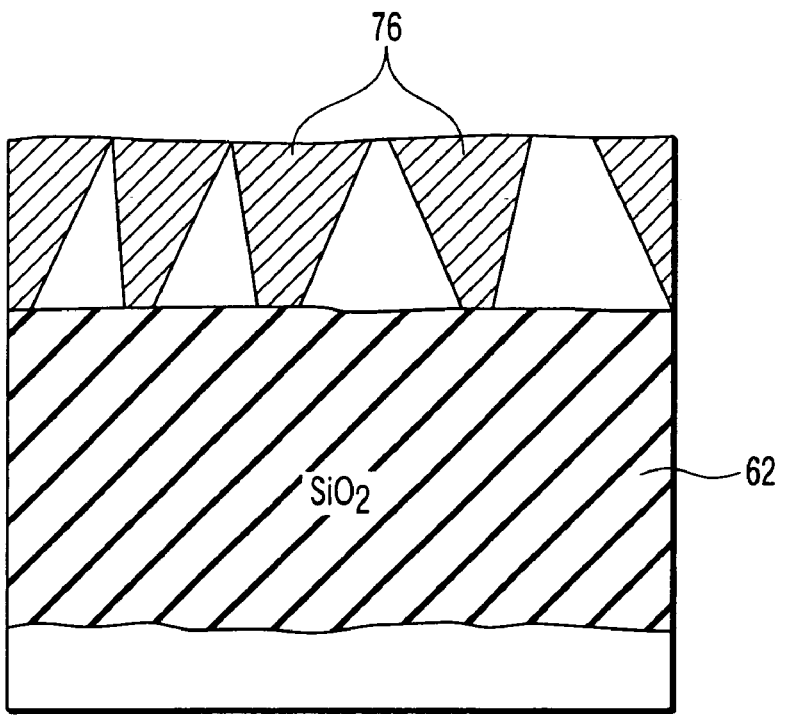

FIGS. 6A and 6B are sectional views showing a poly-silicon film formed by the film formation method according to the embodiment and a poly-silicon film formed by the conventional method, respectively, which were observed by a TEM (Transmission Electron Microscope). As shown in FIG. 6A, the poly-silicon film according to the present example was found to be constructed of an agglomeration of spherical micro-crystalline grains (spherical crystals 75) having similar sizes, and a number of micro-crystalline grains were present one on the other in the film thickness direction. On the other hand, as shown in FIG. 6A, the poly-silicon film according to the comparative example was found to be constructed of an agglomeration of spindle-shaped crystals 76 extending in the film thickness direction, each of which had a top portion larger than the bottom portion (on the silicon oxide film side).

As described above, the poly-silicon film according to the present example has a number of crystal grain boundaries or interfaces between the spherical crystals. In this case, when a carrier impurity element is ion-implanted from above the poly-silicon film in a subsequent step, the impurity ions are trapped at crystal grain boundaries due to a number of boundaries present in the film thickness direction, before they reach the bottom of the poly-silicon film. As a consequence, it is possible to uniformly diffuse the carrier impurity element in the poly-silicon film while preventing the carrier impurity element from penetrating through the film.

On the other hand, the poly-silicon film according to the comparative example is formed of crystals extending in the film thickness direction. Particularly, these crystals are extremely narrowed on the bottom side, and the film thereby has a very low crystal density on the bottom side. In this case, when a carrier impurity element is ion-implanted from above the poly-silicon film in a subsequent step, the impurity ions penetrate through the film without being trapped in the film.

Present Examples 2

Poly-silicon films were formed under different conditions, using the apparatus shown in FIG. 1. The conditions used at this time are shown in FIG. 7, columns CE1 to CE3 and PE1 to PE8. CE1 to CE3 denote comparative examples, in which the film formation process was not followed by a heat process for poly-crystallization. PE1 to PE8 denote present examples according to the embodiment, in which an amorphous silicon film was formed at a temperature of 550° C. or more, and followed by poly-crystallization thereof.

Each poly-silicon film thus formed was then subjected to crystal structure analysis by X-ray diffraction and measurement of refractive index. Measurement of grain size was performed by an X-ray diffraction apparatus on the comparative example CE3, the present examples PE3 and PE4 (the film formation temperature was 550° C.), and the present examples PE6, PE7 and PE8 (the film formation temperature was 580° C.), in terms of the Si (111) plane, Si (220) plane, and Si (311) plane. Measurement of refractive index was performed by a Caliber 300 for all the examples.

FIG. 7 is a characteristic diagram showing the results of crystal structure analysis by X-ray diffraction and measurement of refractive index, which were performed on the poly-silicon films according to the comparative examples and present examples. More specifically, FIG. 7 shows process conditions, i.e., the film formation temperature (Tff), the atmosphere (ATup) in temperature-up from the film formation temperature to the annealing temperature, and the annealing atmosphere and temperature (Aan/Tan); and examination results, i.e., the film thickness (FT), the refractive index (RI), and the grain size (GS) obtained by X-ray diffraction analysis. In FIG. 7, each of the comparative example CE1 and present examples PE6 and PE8 includes a pair of data about the grain size (GS), where the left and right ones respectively denote the center and periphery of a wafer W. Further, the data on the Si (111) plane of the present example PE6 means that the periphery grain size was 8.1 nm.

As shown in FIG. 7, as a result of X-ray diffraction, in the comparative example CE3, the Si (111) plane and Si (220) plane were confirmed. In the present examples PE3 and PE4, the Si (111) plane and Si (220) plane were also confirmed, but the sizes thereon greatly differed from those of the comparative example CE3. In the present examples PE6 to PE8, the Si (111) plane and Si (311) plane were confirmed. Specifically, the poly-silicon films according to the comparative example CE3, present examples PE3 and PE4, and present examples PE6, PE7, and PE8 had different crystal structures from each other.

In the comparative example CE3, the size on the Si (111) plane was 3.1 to 3.9 nm, while the size on the Si (220) plane was as large as 18.8 to 24.5 nm. Judging from the data, it is thought that the film according to the comparative example CE3 was formed of spindle-shaped crystals extending in the film thickness direction.

In the present examples PE3 and PE4, the size (14.1 nm) on the Si (111) plane was almost the same as the size (13.6 nm) on the Si (220) plane, or the size (11.2 nm) on the Si (111) plane was larger than the size (3.4 nm) on the Si (220) plane. Judging from the data, it is thought that each film according to the present examples PE3 and PE4 was formed of a mixture of spindle-shaped crystals extending in the film thickness direction and spherical crystals. Further, although the Si (220) plane was confirmed, the size thereon was far smaller than that of the comparative example CE3. Accordingly, it is thought that a number of spindle-shaped crystals and spherical crystals were present in the film thickness direction, and thus the number of grain boundaries in the film thickness direction was larger than the crystal structure of the comparative example CE3.

In the present examples PE6, PE7, and PE8, the sizes on the Si (111) plane and Si (311) plane were close to each other, and were as small as 5 nm to 9.8 nm. Judging from the data, it is thought that each film according to the present examples PE6, PE7, and PE8 was formed of a number of spherical crystals having similar sizes and randomly stacked. Since such a poly-silicon film includes a number of grain boundaries of spherical crystals randomly formed in all the directions, a carrier impurity element or active species can be easily trapped when it is ion-implanted.

Figure 8:
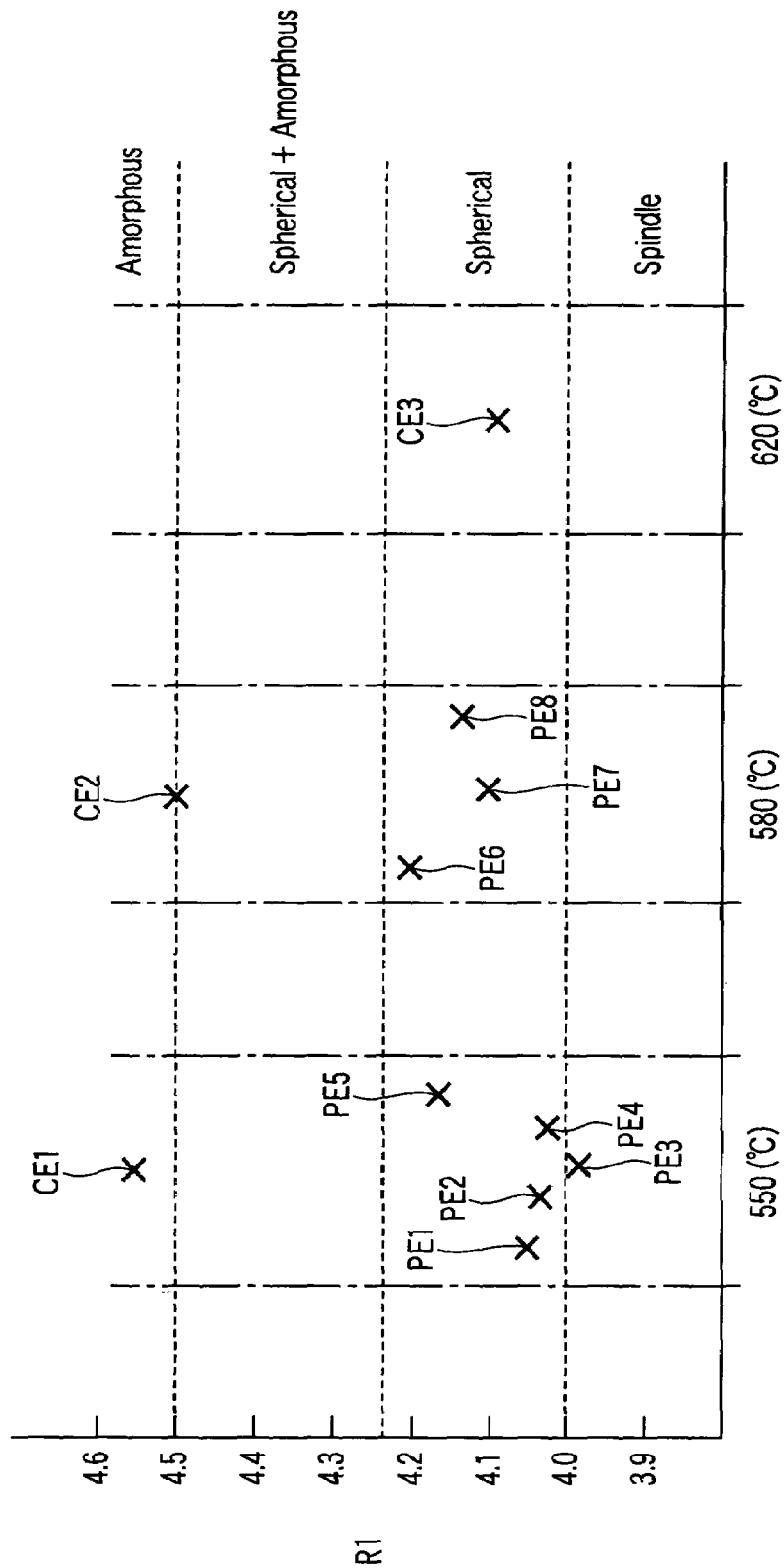
FIG. 8 is a characteristic graph showing the results of measurement of refractive index, which was performed on poly-silicon films according to comparative examples and present examples.

FIG. 8 is a characteristic graph showing the results of measurement of refractive index, which was performed on the poly-silicon films according to the comparative examples and present examples. In FIG. 8, the horizontal axis denotes the film formation temperature (Tff), and the vertical axis denotes the refractive index (RI). As shown in FIG. 8, there is some correlation between the refractive index RI and crystal structure. Where the refractive index is more than 4.5, the structure is formed of an amorphous phase. Where the refractive index is 4.24 to 4.5, the structure is formed of a mixture of spherical crystals and amorphous phase. Where the refractive index is 4.0 to 4.24, the structure is formed of spherical crystals. Where the refractive index is less than 4.0, the structure is formed of spindle-shaped crystals.

The refractive index RI cannot be shown with high accuracy, because the data include errors due to measuring instruments. However, the present examples PE1 to PE4 with a film formation temperature Tff of 550° C. were positioned in the spherical crystal domain close to the spindle-shaped crystal domain. Further, the present examples PE5 to PE8 with a film formation temperature Tff of 580° C. were positioned in the spherical crystal domain close to the mixture (spherical crystal+amorphous) domain. Accordingly, a general tendency can be induced such that the crystal structure of a formed poly-silicon film differs, depending on the film formation temperature Tff. Further, as a result of the refractive index RI, the comparative examples CE1 and CE2 were positioned in the amorphous domain. Accordingly, it is thought that the silicon film according to each of the present examples was also amorphous immediately after the film formation step, and then was crystallized by annealing at a high temperature and transformed into a poly-silicon film.

As described above, there is some correlation between the crystal state of an amorphous silicon film and film formation temperature. In order to form a poly-silicon film with spherical crystals contained therein, it is necessary to perform the amorphous film formation step at a temperature of 550° C. or more. Further, according to the present examples 2, the film formation step is thought to be preferably performed at a temperature of from 560 to 600° C., in order to obtain a poly-silicon film formed of an agglomeration of spherical crystals. In this case, the film formation step provides an amorphous silicon film with a number of nuclei dispersed therein. Then, the nuclei are re-crystallized and grown by the poly-crystallization step, thereby providing a poly-silicon film formed of an agglomeration of spherical crystals.

Where the film formation temperature is 550° C., a poly-silicon film obtained thereafter contains spherical crystals and spindle-shaped crystals in a mixed state. In this case, the degree of dispersion of nuclei is lower than that of the case where the film formation temperature is 560° C. However, the nuclei are still dispersed in amorphous silicon, and crystals then grow from the nuclei, amorphous silicon film surface, and $SiO_2$ interfaces, in the poly-crystallization step. As a consequence, it is thought that the poly-silicon film contains spherical crystals and spindle-shaped crystals in a mixed state.

In summary, the following have been conformed from the results of the present examples 2. Specifically, where the film formation step is performed at 620° C., a poly-crystallized film is formed in this step without fine crystal grains. Where the film formation step is performed at a temperature of from 550 to 560° C., e.g., 550° C., and annealing is then performed, a poly-silicon film obtained is formed of spindle-shaped crystals and spherical crystals. Where the film formation step is performed at a temperature of from 560 to 600° C., e.g., 580° C., and annealing is then performed, a poly-silicon film obtained is formed of fine crystal grains with smaller diameters.

Accordingly, the film formation step should be performed at a temperature of 550° C. or more and lower than a temperature at which poly-silicon is formed, and preferably of from 560 to 600° C. Further, the annealing step should be performed at a temperature for poly-crystallizing an amorphous silicon film, and preferably of from 610 to 700° C.

As a modification of the embodiment, a second poly-silicon film may be formed on the poly-silicon film described above. Specifically, at first, the film formation step and poly-crystallization step are performed to form a first poly-silicon film with a thickness of, e.g., about 50 nm, as described above. Then, a film formation gas containing silicon (such as the same gas as the film formation gas used for the first poly-silicon film) is supplied to form a second poly-silicon film with a thickness of, e.g., about 100 nm on the first poly-silicon film. This step is performed at a temperature to form poly-crystalline silicon, of, e.g., from 610 to 700° C., and preferably 620° C. or more.

According to this modification, when an impurity element is ion-implanted in a subsequent step, the first poly-silicon film traps the impurity element and prevents it from penetrating therethrough. On the other hand, the second poly-silicon film has a high crystal growth rate because it is formed at a temperature for poly-crystallization. Accordingly, for a predetermined thickness, a second poly-silicon film can be formed in a shorter time than the first poly-silicon film. As a consequence, where a gate electrode requires a film thickness of, e.g., about 100 nm, a multi-layer structure of first and second poly-silicon films can shorten the total film formation time, as compared to a case where the required film thickness is fulfilled only by the first poly-silicon film.

Further, as a modification of the embodiment, the temperature-up step may be performed in a hydrogen atmosphere. The poly-crystallization step may be performed in a nitrogen atmosphere. As a carrier impurity to be ion-implanted into a poly-silicon film, indium (In) or aluminum (Al) may be used in place of boron for the P-conductivity type, and phosphorus (P) or arsenic (As) may be used for the N-conductivity type.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method for a semiconductor process, comprising:
    forming an amorphous silicon film on a target substrate by CVD in a process field within a reaction container, while supplying a first process gas containing silicon into the process field, and setting the process field at a first temperature of 550° C. or more and at a first pressure; and
    poly-crystallizing the amorphous silicon film by a heat process in the process field to form a poly-silicon film, while supplying a second process gas different from the first process gas into the process field, and setting the process field at a second temperature higher than the first temperature and at a second pressure.

2. The method according to claim 1, wherein the second process gas comprises one or both of hydrogen gas and an inactive gas.

3. The method according to claim 2, wherein the second process gas is hydrogen gas.

4. The method according to claim 1, wherein the first process gas is a silane family gas.

5. The method according to claim 2, wherein the second pressure is higher than the first pressure.

6. The method according to claim 5, wherein the first pressure is within 13.3 to 40 Pa, and the second pressure is within 2660 to 26600 Pa.

7. The method according to claim 1, wherein the first temperature is 600° C. or less.

8. The method according to claim 7, wherein the second temperature is 610° C. or more.

9. The method according to claim 8, wherein the second temperature 700° C. or less.

10. The method according to claim 1, further comprising forming an upper poly-silicon film on the poly-silicon film by CVD in the process field, while supplying a process gas containing silicon into the process field, and setting the process field at a temperature for poly-crystallizing silicon higher than the first temperature.

11. The method according to claim 1, further comprising ion-implanting a carrier impurity element into the poly-silicon film.

12. The method according to claim 11, wherein the target substrate comprises a gate insulating film, and the poly-silicon film is formed as a gate electrode material on the gate insulating film.

13. A computer readable medium containing program instructions for execution on a processor, which, when executed by the processor, cause a film-formation apparatus for a semiconductor process to execute
    forming an amorphous silicon film on a target substrate by CVD in a process field within a reaction container, while supplying a first process gas containing silicon into the process field, and setting the process field at a first temperature of 550° C. or more and at a first pressure; and
    poly-crystallizing the amorphous silicon film by a heat process in the process field to form a poly-silicon film, while supplying a second process gas different from the first process gas into the process field, and setting the process field at a second temperature higher than the first temperature and at a second pressure.

14. The medium according to claim 13, wherein the program instructions, when executed by the processor, cause the film-formation apparatus for a semiconductor process to execute
    forming an upper poly-silicon film on the poly-silicon film by CVD in the process field, while supplying a process gas containing silicon into the process field, and setting the process field at a temperature for poly-crystallizing silicon higher than the first temperature.

* * * * *